United States Patent
Venkataraman et al.

(10) Patent No.: US 8,803,723 B2
(45) Date of Patent: Aug. 12, 2014

(54) LOW NOISE FRONT END FOR PULSED INPUT SYSTEM

(75) Inventors: Jagannathan Venkataraman, Bangalore (IN); Sandeep Kesrimal Oswal, Bangalore (IN); Vinod Srinivasan Pallakara, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/553,808

(22) Filed: Jul. 19, 2012

(65) Prior Publication Data

US 2013/0021185 A1 Jan. 24, 2013

Related U.S. Application Data

(60) Provisional application No. 61/509,673, filed on Jul. 20, 2011.

(51) Int. Cl.
*H03M 1/12* (2006.01)

(52) U.S. Cl.
CPC .................................. *H03M 1/12* (2013.01)
USPC .............. 341/155; 341/61; 341/122; 341/143

(58) Field of Classification Search
CPC ....... H03M 1/12; H03M 1/188; H03M 1/504; H03M 1/822; H03M 1/0626; H03M 1/0682; H03M 3/30; H03M 3/37; H03M 3/39; H03M 3/402; H03M 3/438
USPC .................................... 341/61, 143, 122, 155
See application file for complete search history.

(56) References Cited

U.S. PATENT DOCUMENTS

| | | | | |
|---|---|---|---|---|
| 5,329,281 A * | 7/1994 | Baumgartner et al. | ........ | 341/139 |
| 5,742,189 A * | 4/1998 | Yoshida et al. | ................ | 327/113 |
| 7,440,737 B2 * | 10/2008 | Su | ................... | 455/223 |
| 7,551,666 B2 * | 6/2009 | Mori et al. | ...................... | 375/219 |
| 7,564,389 B1 * | 7/2009 | Byrd et al. | ..................... | 341/143 |
| 8,643,526 B1 * | 2/2014 | Dey et al. | ....................... | 341/155 |
| 2002/0181614 A1 * | 12/2002 | Mostafa et al. | ............... | 375/316 |
| 2004/0070511 A1 * | 4/2004 | Kim | ........................... | 340/636.1 |
| 2005/0110667 A1 * | 5/2005 | Borisavljevic | ................ | 341/152 |
| 2007/0285296 A1 * | 12/2007 | Bilhan | ......................... | 341/155 |
| 2008/0266157 A1 * | 10/2008 | Gorin et al. | .................... | 341/155 |
| 2010/0105349 A1 * | 4/2010 | Qian | ............................. | 455/323 |
| 2011/0040818 A1 * | 2/2011 | Fagg et al. | ..................... | 708/313 |

OTHER PUBLICATIONS

"Pulse oximetry", Wikipedia, pp. 1-6, available at http://en.wikipedia.org/wiki/Pulse_oximetry on Jun. 27, 2012.

* cited by examiner

*Primary Examiner* — Linh Nguyen

(74) *Attorney, Agent, or Firm* — Alan A. R. Cooper; Frederick J. Telecky, Jr.

(57) ABSTRACT

Embodiments of the invention provide a pulsed signal detection system with reduced noise bandwidth in the frontend. Analog to digital conversion speed is decoupled from the pulsed duty cycle timing. This in turn reduces the power consumption of the ADC and the front end while providing a high dynamic range. The ADC may be a continuous time sigma delta converter to reduce the drive requirements of the front end.

20 Claims, 4 Drawing Sheets

LOW NOISE FRONT END FOR PULSED INPUT SYSTEM

CLAIM OF PRIORITY UNDER 35 U.S.C. §119(e)

The present application claims priority to and incorporates by reference U.S. Provisional Application No. 61/509,673 filed Jul. 20, 2011, entitled "Low Noise Low Power Front End For Pulsed Input Systems

FIELD OF THE INVENTION

Embodiments of the invention are directed, in general, to electronic systems and, more specifically, to low noise low power front end and methods using same.

BACKGROUND OF THE INVENTION

Pulse oximetry is a non-invasive method that may be used to monitor the saturation of a patient's hemoglobin. A sensor may be placed on a thin part of the patient's body, usually a fingertip or earlobe, for example. Light of two different wavelengths is passed through the patient to a photo detector. The changing absorbance at each of the wavelengths is measured, allowing determination of the absorbances due to the pulsing arterial blood alone, excluding venous blood, skin, bone, muscle, fat, etc.

Pulse oximetry typically utilizes a pair of small light-emitting diodes (LEDs) facing a photodiode through a translucent part of the patient's body, usually a fingertip or an earlobe. One LED is red, with wavelength of 660 nm, and the other is infrared, 905, 910, or 940 nm. Absorption at these wavelengths differs significantly between oxyhemoglobin and its deoxygenated form; therefore, the oxy/deoxyhemoglobin ratio can be calculated from the ratio of the absorption of the red and infrared light. The monitored signal bounces in time with the heart beat because the arterial blood vessels expand and contract with each heartbeat. By examining only the varying part of the absorption spectrum (essentially, subtracting minimum absorption from peak absorption), a monitor can ignore other tissues or nail polish, and discern only the absorption caused by arterial blood.

In pulsed input measurement systems, such as for oximetry, the front end transimpedance amplifiers or gain amplifiers need to have a large bandwidth in order to support the pulsing input signals. Whereas the signal bandwidth of interest is much smaller, but because of the large bandwidth for settling the equivalent noise bandwidth of the front end is larger.

BRIEF DESCRIPTION OF THE DRAWINGS

Particular embodiments in accordance with the invention will now be described, by way of example only, and with reference to the accompanying drawings.

Figure 1:
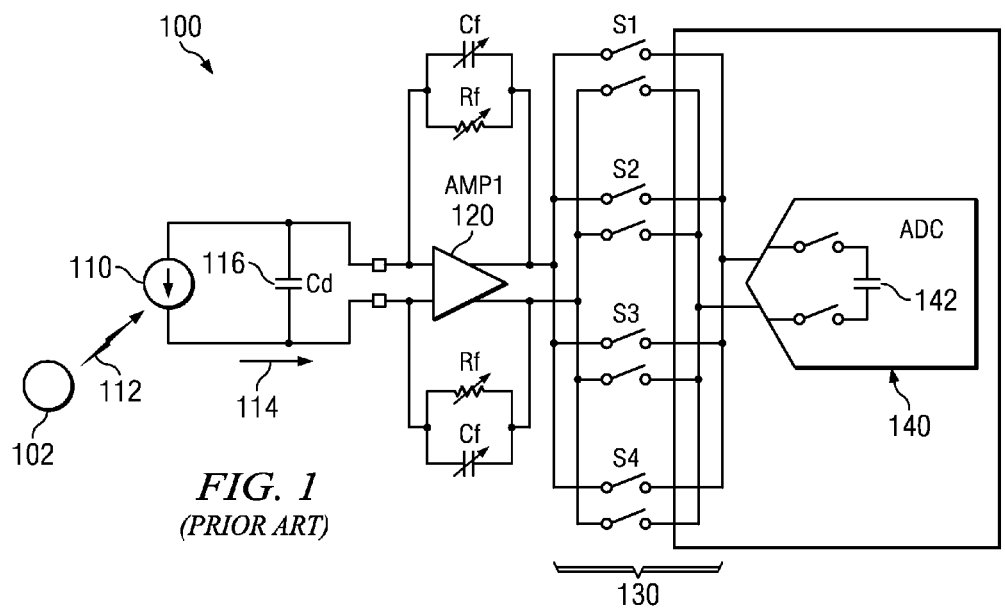
FIGS. 1 and 2 are schematics of prior art pulsed input systems.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Certain measurement systems and medical systems, such as pulseoximetry, have pulsed input signals with low duty cycles. The input signal of interest may be at a low frequency and is carried on the pulsed, low duty cycle input signal. For example, in a test instrument there may be a photodiode that is illuminated by an LED (light emitting diode) at a predefined pulse recurrence frequency (PRF) of 1 kHz with duty cycles of 5%. In order to provide a high dynamic range with a high noise bandwidth, the front end noise needs to be much lower which may result in high power consumption by the front end. If the analog to digital converter (ADC) is used directly at the output of the frontend, the ADC may need to be run at high speeds to support low pulsing duty cycles. Embodiments of the invention reduce the noise bandwidth of the frontend and also decouple the ADC conversion speed from the pulsed duty cycle timing. This in turn reduces the power consumption of the ADC and the front end to meet high dynamic range. Embodiments of the invention may also include continuous time sigma delta ADC that reduces the drive requirements of the front end.

FIG. 1 is a schematic of a prior art pulsed input system 100. Detector 110 receives pulses of light or infrared from a light emitting diode or other transmitter device 102 and generates current pulses 114 in response to the received pulses 112. LEDs 102 consume a lot of power so they are pulsed at a low duty cycle to reduce system power consumption. Transimpedance amplifier 120 receives the current pulses. A transimpedance amplifier converts current to voltage. Its input ideally has zero impedance and the input signal is a current. The output signal is measured as a voltage. Because the output is a voltage and the input is a current, the gain, or ratio of output to input, is expressed in units of ohms.

Short duration current pulses 114 are amplified using transimpedance amplifier 120 and then digitized by ADC 140 to achieve a high dynamic range in the range of 100 dB. Transimpedance amplifier 120 feeds a switched capacitor sigma delta ADC 140. In other examples, ADC 140 may be a successive-approximation register (SAR) converter. Transimpedance amplifier 120 needs to charge the ADC sampling capacitor 142 during short time periods defined by S1, S2, S3, S4 using switching array 130. Typically, in order to achieve a dynamic range of 16 bits, capacitor 142 is a large capacitor. Typically, switched capacitor sigma delta converters of 16-18 b resolution present capacitors that need to be switched at high oversampling rates. This increases the bandwidth specification and power consumption of transimpedance amplifier 120.

In prior pulsed input systems, the front end transimpedance amplifier has to have a large bandwidth to support the pulsed input waveforms. Thus, the noise output by the front end transimpedance amplifier (TA) 120 is represented by equations (1) and (2).

$$TAoutput\ noise = Vn*Cd/Cf*NBW \qquad (1)$$

Where:
NBW is the noise bandwidth;
Vn is the input referred voltage noise density expressed in Votls/sqrt (Hz);
Cd is input capacitance; and
Cf is feedback capacitance.

$$NBW = settlingBW*signalBW/PRF \qquad (2)$$

Where:
settlingBW is the bandwidth needed for settling;
signalBW is the bandwidth of signal 112, and
PRF is pulse repetition frequency of input signal 112 provided by transmitter device 102.

Settling bandwidth (settlingBW) needs to be higher to meet low duty cycle pulse inputs that are required to reduce power used by transmitter device 102. This in turn increases the total output noise for a given power. Thus, the front end amplifier 120 power needs to be high to meet a high dynamic range. Also by directly using front end amplifier 120 to drive ADC 140, the power capability of front end amplifier 120 needs to be increased. Since the ADC conversion speed is also coupled to the duty cycle pulse time, the ADC power requirement is also high.

The transimpedance amplifier bandwidth is set by the S1/S2/S3/S4 sampling periods. Thus, for large Cd's 116 the TAoutput noise sees a gain of Cd/cf and is integrated by the TA bandwidth that is set by the pulse time S1/S2/S3/S4. For example, for PRF=1 Khz, 5% duty cycle S1/S2/S3/S4=50 uS. TA BW for 10 tau settlingBW is 35 khz. The bandwidth is selected to provide approximately ten time-constants of settling within the pulse time. Tau is the time constant in sec. So, noise is integrated in this entire bandwidth in FIG. 1 where it feeds the switched capacitor ADC 140.

Figure 2:
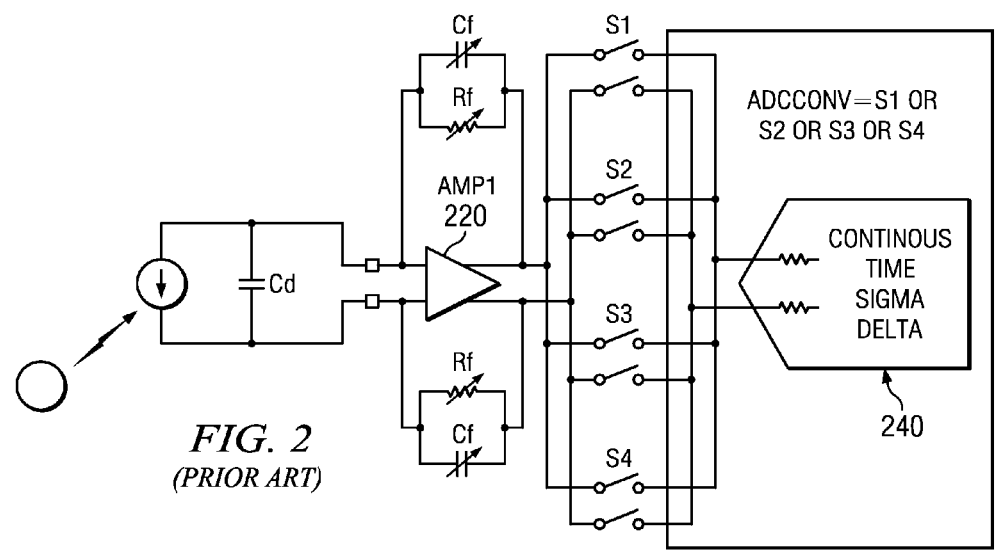

In FIG. 2, ADC 240 is a continuous time sigma delta (CTSD) converter that has inherent antialiasing and also presents a resistive load. This reduces the power needed from transimpedance amplifier 220. However, ADC 240 needs to run at a high conversion rate determined by pulses S1,S2,S3, S4. Since the pulse time is defined by S1,S2,S3,S4, the signal is available to the ADC during this time. Therefore, the ADC has to do each conversion within the S1/S2/S3/S4 times while the TA is directly hooked to the ADC and thus the ADC conversion rate needs to be higher.

The general operation of a CTSD converter is well known. Much like the discrete-time sigma-delta converters found in many high-precision applications, the continuous-time sigma-delta architecture incorporates oversampling and noise shaping to achieve high resolution. A perfect N-bit ADC has a rms quantization noise of $q/v12$ uniformly distributed within the Nyquist band from dc to $f_s/2$, where q is the value of an LSB and $f_s$ is the sample rate. If the sample rate increases to $kf_s$, the rms quantization noise remains $q/v12$; however, the noise is now distributed over a wider bandwidth from dc to $kf_s/2$. The factor k is referred to as the oversampling ratio (OSR). Since the quantization noise is distributed over a wider bandwidth, the noise within a narrow band of interest is reduced by a factor of vk. In combination with the principle of oversampling, a sigma-delta converter applies noise shaping in the modulator to further reduce the quantization noise within the band of interest. Noise shaping, as the name implies, involves attenuating the in-band quantization noise at the expense of amplifying noise in the out-of-band region. The resulting spectrum at the output has minimal quantization noise in-band and large out-of-band noise. If a digital low-pass filter is applied to the output, the out-of-band noise can be removed. After filtering, the out-of-band region contains no quantization noise or signal, allowing the output data rate to be reduced without corrupting the in-band signal. This process of filtering and sampling-rate reduction is commonly referred to as decimation filtering. The decimation filter removes the large out-of-band noise; the result is a high-performance, wide-dynamic-range analog-to-digital converter.

Even in the scheme of FIG. 2 where the CTSD converter has antialiasing and operating at S1/S2/S3/S4 rates, the noise bandwidth is 20 Khz, which is the conversion rate of the CTSD ADC. For example, referring back to equation (2), when the PRF rate is 1 Khz and the final signal bandwidth of interest is 40 Hz, then the equivalent noise bandwidth for the prior art systems of FIG. 1 and FIG. 2 is as follows, where TABW is the settling BW needed and the signalBW of interest (40 Hz) is multiplied by two to account for oversampling.

equivalent Noise bandwidth
  NBW=TABW*SignalBW/PRF equivalent Noise bandwidth NBW=TABW*80 Hz/1 KHz.(for FIG. 1)

equivalent Noise bandwidth NBW=20 Khz*80 Hz/1 KHz.(for FIG. 2)

Thus, for larger Cd/Cf ratios the input referred noise spec, Vn, of the transimpedance amplifier needs to be very small and this leads to high power usage by the transimpedance amplifier.

Figure 3:
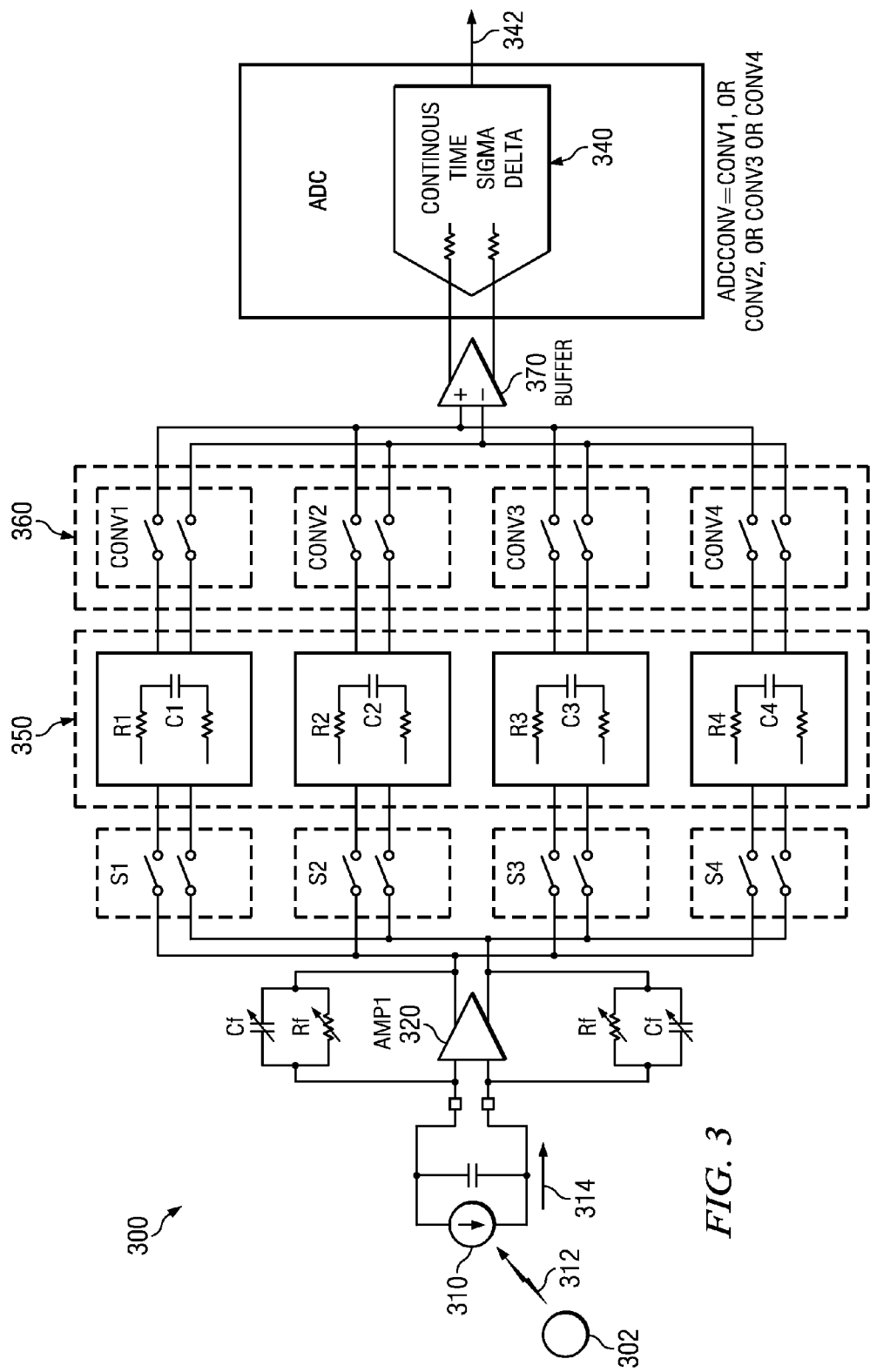
FIG. 3 is a schematic of a pulsed input signal processor with reduced noise bandwidth.

FIG. 3 is a schematic of a pulsed input signal processor 300 that includes a filter stage 350 and a sampling stage 360 at the output of transimpedance amplifier 320 to limit the noise bandwidth. This scheme limits the noise bandwidth of the front end that is propagated to ADC 340. The resultant noise bandwidth is represented by equation (3).

$$NBW = BWfilter*SignalBW/PRF \qquad (3)$$

where:
BWfilter is the bandwidth of filter stage 350;
SignalBW is the bandwidth of signal 312; and
PRF is the pulse repetition frequency of input signal 312 provided by transmitter device 302.

For example, in one embodiment, NBW=1 khz*80/1 Khz.

Thus, comparing equation (3) to equation (2) and depending on the BWfilter and settlingBW, the noise may be an order of magnitude better which leads to lower power needed in transimpedance amplifier front end 320 to meet a high dynamic range.

Sampling stage 360 allows the ADC conversion (ADC-CONV) time to be decoupled from the sampling pulses S1,S2,S3,S4 that typically have a low duty cycle. Thus, the ADC conversion speed is determined by the PRF and not by the pulse time. This reduces the power requirement for ADC 340 as well. For example, CONV1 may be 1/(4*PRF) in this embodiment since four conversions are done in one PRF time period.

Filter stage 350 includes several sections that each function as RC filters. In this embodiment, one section of filter 350 is used for each sampling pulse S1,S2,S3,S4. For the examples discussed above, the filter frequency may be selected to be 1 Khz; in which case the R1, C1 may therefore be selected to be approximately 100 kohms, 100 pf. The capacitors C1, C2, C3, C4 in filter bank 350 are not reset after sampling and keep accumulating. Thus, at steady state the filter bank does not load transimpedance amplifier 320. The transfer function H(z) of the filter and sampler is represented by equation (4).

$$H(z)=(1-e^{-k})/(1-kZ^{-1}) \quad (4)$$

Where:
k=Tpulse/Tau; and
Tau=1/RCfilt.

The sampled capacitor value is fed in to a continuous time sigma delta ADC 340 through a buffer 370. ADC 340 may provide a stream of digitized samples 342 to other processing modules.

Figure 4:
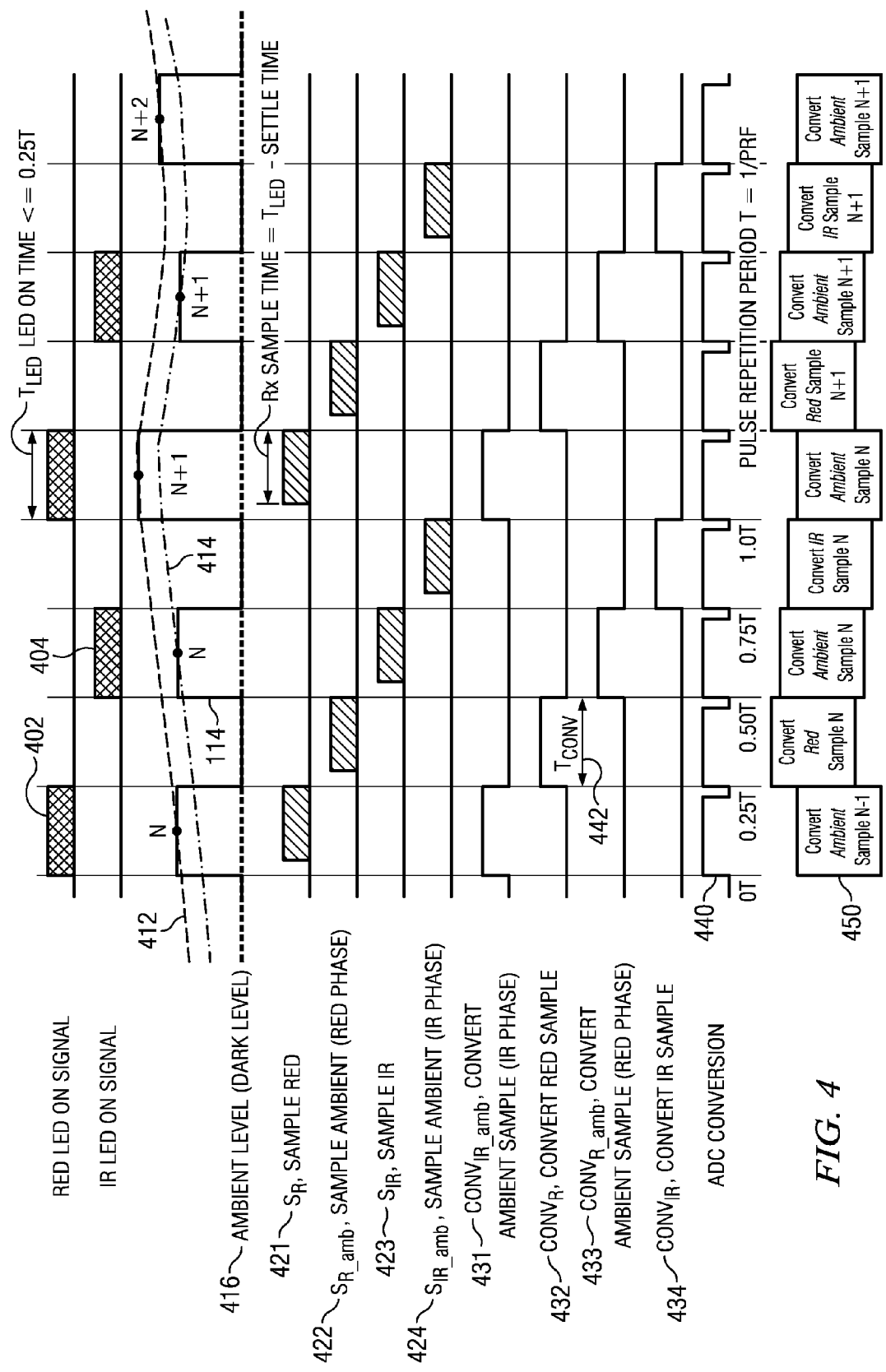
FIG. 4 illustrates waveforms at the input and output of the system that illustrates the pulses and the low frequency signal of interest.

FIG. 4 illustrates waveforms at the input and output of system 300 that illustrate pulses 402, 404 and low frequency signals of interest 412, 414.

In this embodiment, a pair of small light-emitting diodes (LEDs) is arranged to face a photodiode through a translucent part of the patient's body, usually a fingertip or an earlobe. One LED is red, with wavelength of 660 nm, and the other is infrared, 905, 910, or 940 nm. Absorption at these wavelengths differs significantly between oxyhemoglobin and its deoxygenated form; therefore, the oxy/deoxyhemoglobin ratio can be calculated from the ratio of the absorption of the red and infrared light. The monitored signal bounces in time with the heart beat because the arterial blood vessels expand and contract with each heartbeat. By examining only the varying part of the absorption spectrum (essentially, subtracting minimum absorption from peak absorption), a monitor can ignore other tissues or nail polish, and discern only the absorption caused by arterial blood. Plethysmograph signals 412, 414 represent the low frequency signals of interest that would be produced if the LEDs where on continuously. Since the LEDs are pulsed, these low frequency signals are carried by the pulses and are therefore not present when the LED is turned off. These signals may be sampled and be used to determine a subject's heart rate as well as amount of oxygen in blood using pulse oximetry as described above.

A single detector, such as detector 310 of FIG. 3, may be used to receive light pulses corresponding to red LED pulse 402 and infrared LED pulse 404. A current is produced by detector 310 that is proportional to received light. This current is then amplified and converted to a voltage by transconductance amplifier 320. During each of sample phases 421-424, the analog voltage output from TA 320 sampled. The sample phase width may be varied from 0 to 25% of duty cycle of each pulse repetition period (PRP) T. During sample phase 421, a voltage sample is obtained that corresponds to input current 314 during activation of the red LED. During sample phase 422, a voltage sample is obtained that corresponds to input current 314 while both LEDs or turned off, which therefore corresponds to ambient light effect. During sample phase 423, a voltage sample is obtained that corresponds to input current 314 during activation of the infrared LED. During sample phase 424, a voltage sample is obtained that corresponds to input current 314 while both LEDs or turned off. Sample phases 421-424 are indicated as S1,S2,S3,S4 in FIG. 3.

During each convert phase 431-434, each sampled analog voltage is converted 440 to a digital code 450. ADC conversion time Tconv 442 is fixed at approximately 25% duty cycle of PRP T. Convert phases 431-434 are indicated as CONV1-CONV4 in FIG. 3.

Figure 5:
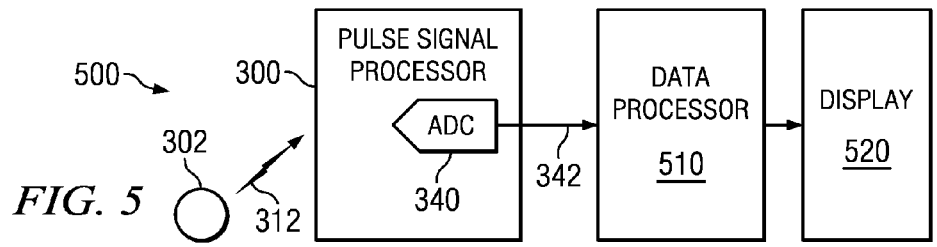
FIG. 5 illustrates a system that includes a pulsed input signal processor.

FIG. 5 illustrates a system 500 that includes pulsed input signal processor 300. ADC 340 provides a stream of digitized samples 342, as described in more detail above. The digitized samples may be used by data processor 510 to determine information provided by pulsed input signal 312. For example, processor 510 may determine pulse rate and hemoglobin saturation of a patient when pulsed input signal 312 passes through the patient by processing digitized samples 342. The resultant pulse rate and saturation ration may be provided on display 520. Data processor 510 may be a central processing unit (CPU) coupled to a memory that holds software instructions, for example. Display 520 may be any type of known or later developed devices for displaying human readable information, for example. Display 520 may be physically packaged together with data processor 510 and pulsed signal processor 300, or they may be in separate packages. For example, data processor 510 and display 520 may be part of a mobile device, such as a smart phone, a personal digital assistant, a tablet computer, a personal computer, etc.

Figure 6:
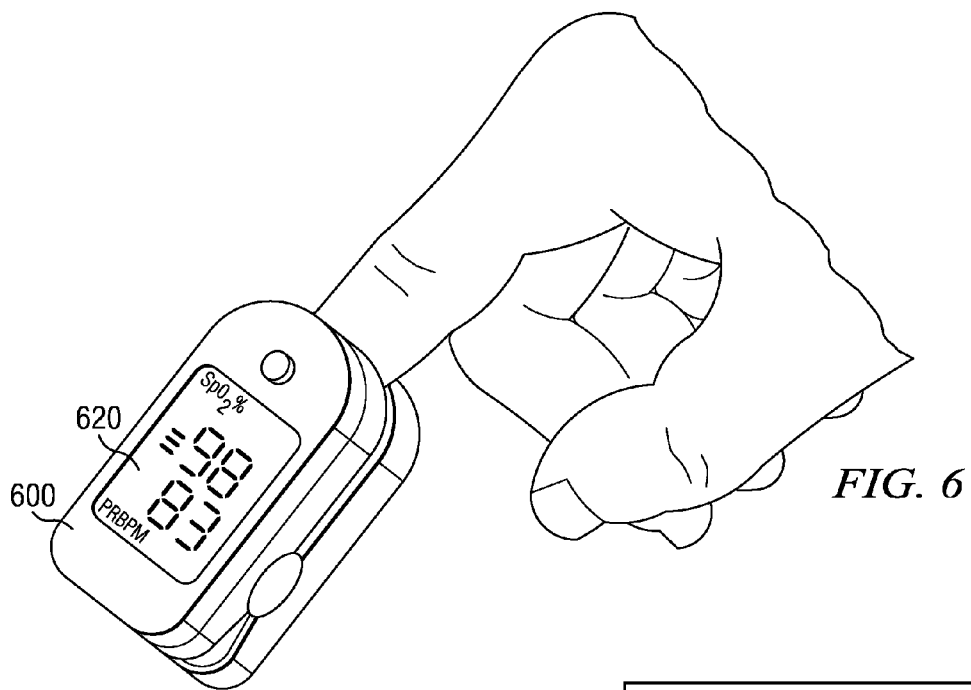
FIG. 6 illustrates a medical device that includes a pulsed input signal processor.

FIG. 6 illustrates a medical device 600 that includes a pulsed input system as described herein. In this example, device 600 is configured to clip over the end of a finger or earlobe. A pair of small light-emitting diodes (LEDs) is configured to face a photodiode through a translucent part of the patient's body, such as a fingertip or an earlobe. One LED is red, with wavelength of 660 nm, and the other is infrared, 905, 910, or 940 nm, for example. Absorption at these wavelengths differs significantly between oxyhemoglobin and its deoxygenated form; therefore, the oxy/deoxyhemoglobin ratio can be calculated from the ratio of the absorption of the red and infrared light.

The monitored signal bounces in time with the heart beat because the arterial blood vessels expand and contract with each heartbeat. By examining only the varying part of the absorption spectrum, a monitor can ignore other tissues or nail polish, and discern only the absorption caused by arterial blood. Thus, pulse rate may also be detected and used to subtract minimum absorption from peak absorption. Pulse rate and $O_2$ saturation percentage may be displayed on display 620.

Device 600 includes a pulsed input system similar to that described with regard to FIG. 3. As described in more detail above, embodiments of the invention reduce the noise bandwidth of the frontend by using a filter stage coupled to the output of the front end transimpedance amplifier. Embodiments of the invention may also decouple the ADC conversion speed from the pulsed duty cycle timing by using a sampling stage coupled to the output of the filter stage. This in turn reduces the power consumption of the ADC and the front end to meet high dynamic range. Embodiments of the invention may also include a continuous time sigma delta ADC that reduces the drive requirements of the front end.

Figure 7:
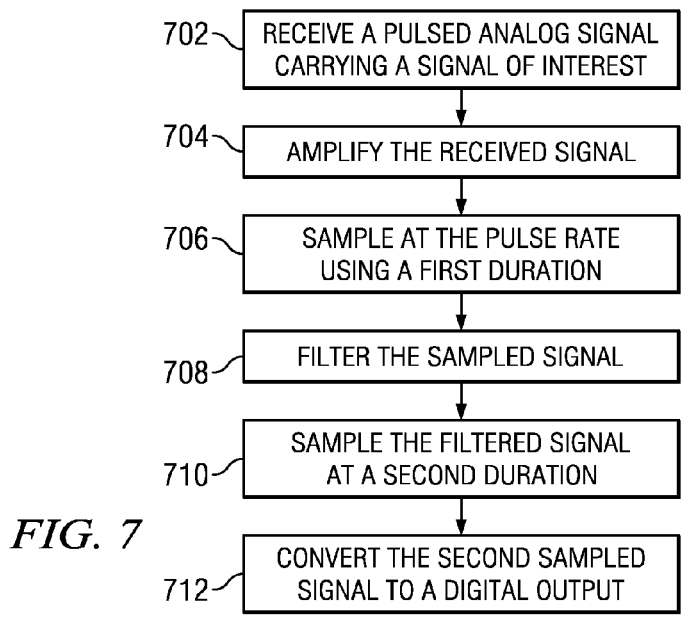
FIG. 7 is a flow diagram illustrating operation of a pulsed input signal system.

FIG. 7 is a flow diagram illustrating operation of a pulsed input signal system. A pulsed analog signal that carries a signal of interest is received 702. There may be one or more signals of interest carried on the pulses in a multiplexed manner. For example, the signal of interest may be plethysmograph signals derived from one or more light sources that may be indicative of a subject's heart rate as well as amount of oxygen in the subject's blood. The pulsed signal may be received by a photo detector, as described in more detail above.

The signal of interest may have a frequency that is lower than the pulse rate. For example, the signal of interest may have a frequency that is related to heart beat rate, which is nominally 60 beats per minute, while the pulsed signal may have a pulse recurrence frequency of 1 khz.

The received pulsed signal may be amplified 704 to form an amplified pulsed signal. In one embodiment, the received pulsed signal may be amplified by a transimpedance amplifier that converts a current signal into a voltage signal.

The amplified pulsed signal is sampled 706 at a rate that matches the pulse rate of the pulsed signal to form a sampled signal. In this manner, one sample is taken for each pulse. In another embodiment, two or more samples may be taken for each pulse. Each sample is taken over a period of time that has a defined duration time. In this embodiment, there is a set of sampling pulses, referred to as S1,S2,S3,S4 in FIG. 3.

The sampled signal is then filtered 708. The filter stage may include several sections that each function as RC filters. In this embodiment, one section of filter is used for each sampling pulse in the set of sampling pulses. For the examples discussed above, the filter frequency may be selected to be 1 Khz; in which case the R1, C1 may therefore be selected to be approximately 100 kohms, 100 pf.

The filtered signal is then sampled 710 at a second sample rate and a second sample duration to form a second sampled signal. This allows the ADC conversion (ADCCONV) time to be decoupled from the sampling pulses S1,S2,S3,S4 that typically have a low duty cycle. Thus, the ADC conversion speed is determined by the PRF and not by the pulse time. For example, the second sample duration may be longer than the first sample duration.

The sampled analog signal is then converted 712 to a digital output signal using an analog to digital converter. In this embodiment, a continuous time sigma delta converter that has inherent antialiasing and also presents a resistive load is used to perform the analog to digital conversion. This reduces the power needed from transimpedance amplifier.

Other Embodiments

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed.

While a specific standalone medical device was described, other devices that comprise a detection device with a pulsed input system as described herein may be connected to a monitoring system that gathers information from several sensors and displays it on a single display. In another embodiment, a detection device may be connected to a mobile device, such as a cell phone, personal digital assistant, table computer, etc in order to display a representation of a signal captured and processed by the detection device.

Various control functions and processing functions described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Although specific terms are employed herein, they are used in a generic and descriptive sense only and not for purposes of limitation. Certain terms are used throughout the description and the claims to refer to particular system components. As one skilled in the art will appreciate, components in systems may be referred to by different names and/or may be combined in ways not shown herein without departing from the described functionality. This document does not intend to distinguish between components that differ in name but not function.

In the discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method of operating a pulsed input system, the method comprising:
   receiving a pulsed analog signal carrying a signal of interest;
   amplifying the received pulsed signal using an amplifier to form an amplified pulsed signal having a high side and a low side;
   sampling the amplified pulsed signal of the high side and the low side at a pulse rate of each pulse and at a first sample duration to form a first sampled signal;
   sampling the amplified pulsed signal of the high side and the low side at a pulse rate of each pulse and at a first sample duration to form a second sampled signal;
   filtering the first input sampled signal that transitions between the high side and the low side;
   filtering the first sampled signal that transitions between the high side and the low side;
   sampling the filtered first input sample signal at an intermediate output sample rate and an output sample duration to form a first sampled intermediate output signal having a high side and a low side;
   sampling the filtered second sample signal at the inner output sample rate and the output sample duration to form a second intermediate sampled output signal having a high side and a low side,
   wherein an output of each intermediate sampling is conveyed to an inverting and non-inverting input of analog to digital converter, and
   converting the first and second sampled intermediate output signals to a digital output signal using an analog to digital converter.

2. The method of claim 1, wherein the signal of interest has a frequency that is lower than the pulse rate.

3. The method of claim 1, wherein the second duration is longer than the first duration.

4. The method of claim 1, wherein the second rate is the same as the pulse rate.

5. The method of claim 1, further comprising buffering the first second sampled intermediate signal prior to converting it.

6. The method of claim 1, wherein converting the second sampled signal is performed by a continuous time sigma delta converter.

7. The method of claim 1, wherein the pulsed analog signal carries two or more signals of interested multiplexed on respective pulses.

8. A system comprising a pulsed input signal detector, where the pulsed input signal detector comprises:
 a receiver configured to receive a pulsed analog signal carrying a signal of interest;
 an amplifier coupled to an output of the receiver, the amplifier having a high side and a low side both coupled to an output of the receiver, the amplifier also having a high side and a low side output;
 a plurality of sampling modules coupled to an output of the amplifier;
 a plurality of filtering modules, wherein each filtering module is coupled to an output of its corresponding sampling module; wherein each filtering module includes a resistor and capacitor;
 a plurality of second sampling modules, each sampling module coupled to an output of its own filtering module, the output of each filtering module having a high side and a low side; and
 an analog to digital converter coupled to an output of each of the second sampling modules, each input of the analog to digital converter having a high side and a low side input, wherein an output of each second sampling module is coupled to both a positive and negative input of analog to digital converter.

9. The system of claim 8, further comprising a transmitter device configured to produce the pulsed signal.

10. The system of claim 9, further comprising a display screen coupled to the pulsed input signal detector configured to display results derived from the pulsed input signal detector.

11. A system comprising a pulsed input signal detector, where the pulsed input signal detector comprises:
 means for receiving a pulsed analog signal carrying a signal of interest;
 means for amplifying the received pulsed signal using an amplifier to form an amplified pulsed signal, the means for amplifying the having a high side and a low side both coupled to an output of the receiver, the means for amplifying also having a high side and a low side output;
 means for sampling the amplified pulsed signal at a pulse rate of each pulse and at a first sample duration to form a first sampled signal;
 means for sampling the amplified pulsed signal of the high side and the low side at a pulse rate of each pulse and at a first sample duration to form a second sampled signal;
 means for filtering the first input sampled signal, the output of the means for filtering having a high side and a low side; and;
 means for filtering the first sampled signals that transitions between the high side and the low side;
 means for sampling the filtered first input sample signal at an intermediate output sample rate and an output sample duration to form a first sampled intermediate output signal;
 means for sampling the filtered second sample signal at the inner output sample rate and the output sample duration to form a second intermediate sampled output signal having a high side and a low side,
 wherein an output of each intermediate sampling is conveyed to an inverting and non-inverting input of analog to digital converter, and
 means for converting the second sampled signal to a digital output signal, the means for converting having a high side and low side input.

12. The system of claim 11, further comprising a transmitter device configured to produce the pulsed analog signal.

13. The system of claim 12, further comprising a display screen coupled to the pulsed input signal detector configured to display results derived from the pulsed input signal detector.

14. The system of claim 12, further comprising a buffer interposed between the means for sampling the filtered first sample signal at a second sample rate and the means for converting the second sampled signal to a digital output signal.

15. The system of claim 11, wherein the means for converting the second sampled signal to a digital output signal is performed by a continuous time sigma delta converter.

16. The system of claim 11, wherein the pulsed analog signal carries two or more signals of interested multiplexed on respective pulses.

17. The system of claim 11, wherein the signal of interest has a frequency that is lower than the pulse rate.

18. The system of claim 11, wherein the means for converting the second sampled signal to a digital output signal is performed by a continuous time sigma delta converter.

19. The system of claim 18, further comprising a transmitter device configured to produce the pulsed analog signal.

20. The system of claim 19, further comprising a display screen coupled to the pulsed input signal detector configured to display results derived from the pulsed input signal detector.

* * * * *